(12) United States Patent
Lee

(10) Patent No.: US 7,009,899 B2
(45) Date of Patent: Mar. 7, 2006

(54) BIT LINE PRECHARGE SIGNAL GENERATOR FOR MEMORY DEVICE

(75) Inventor: Chang Hyuk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 211 days.

(21) Appl. No.: 10/670,579

(22) Filed: Sep. 25, 2003

(65) Prior Publication Data

US 2004/0257895 A1 Dec. 23, 2004

(30) Foreign Application Priority Data

Jun. 20, 2003 (KR) ............... 10-2003-0040242

(51) Int. Cl.
*G11C 7/00* (2006.01)
*G11C 7/02* (2006.01)
*G11C 5/06* (2006.01)
*G11C 8/00* (2006.01)

(52) U.S. Cl. ............... 365/203; 365/207; 365/230.03; 365/230.06; 365/214; 365/63; 365/191

(58) Field of Classification Search ............... 365/203, 365/191, 189.08, 214, 207, 63, 230.03, 230.06
See application file for complete search history.

(56) References Cited

U.S. PATENT DOCUMENTS 4,130,896 A * 12/1978 Inadachi ............... 365/203

| 5,555,523 | A | * | 9/1996 | Haga et al. ............... 365/203 |
| 5,559,746 | A | * | 9/1996 | Fukuzo ............... 365/203 |
| 5,594,691 | A | * | 1/1997 | Bashir ............... 365/185.03 |
| 5,745,422 | A | * | 4/1998 | Iadanza ............... 365/203 |
| 5,757,716 | A | * | 5/1998 | Lee ............... 365/230.03 |
| 5,835,432 | A | * | 11/1998 | Nakano ............... 365/205 |
| 5,841,716 | A | * | 11/1998 | Iwaki ............... 365/203 |
| 6,038,158 | A | * | 3/2000 | Bessho et al. ............... 365/51 |
| 6,061,285 | A | * | 5/2000 | Tsukikawa ............... 365/201 |
| 6,154,402 | A | * | 11/2000 | Akita ............... 365/203 |
| 6,535,435 | B1 | * | 3/2003 | Tanaka et al. ............... 365/189.09 |
| 6,597,616 | B1 | * | 7/2003 | Tsern et al. ............... 365/222 |
| 6,603,692 | B1 | * | 8/2003 | Hirota ............... 365/203 |
| 6,614,712 | B1 | * | 9/2003 | Uchida et al. ............... 365/230.06 |
| 6,728,125 | B1 | * | 4/2004 | Hong ............... 365/51 |

* cited by examiner

*Primary Examiner*—Huan Hoang
*Assistant Examiner*—Ly Duy Pham
(74) *Attorney, Agent, or Firm*—Ladas & Parry LLP

(57) ABSTRACT

Disclosed is a bit line precharge signal generator for a memory device, which reduces a resistance component of a signal line by shortening the length of a signal line transferring bit line signals, and reduces an RC time delay. Control signal generator generates a first control signal. A plurality of bit line precharge signal drivers are controlled by first control signal from control signal generator. Each of the bit line precharge signal drivers applies a second signal to the bit line sense amplifier array which is adjacent to bit line precharge signal driver. By using bit line precharge signal generator, a necessary operation is performed within a short time, and unneccessary signal lines are reduced. As a result, a total layout area is reduced.

7 Claims, 5 Drawing Sheets

BIT LINE PRECHARGE SIGNAL GENERATOR FOR MEMORY DEVICE

BACKGROUND OF THE INVENTION

1. Field of the Invention

The present invention relates to a bit line precharge signal generator for a memory device, and more particularly to a bit line precharge signal generator for a memory device which reduces a time delay occurring in a bit line.

2. Description of the Prior Art

As generally known in the art, a memory device such as a DRAM, SDRAM, or DDR DRAM transfers data stored in a memory cell to a bit line during a reading operation. A bit line sense amplifier senses and amplifies the data, transfers the data through a data line, and precharges a bit line. Then the memory device prepares a next operation.

In the same manner, the memory device transfers data to the bit line through a data bus during the writing operation. The bit line sense amplifier senses the data, stores it in the memory cell, and precharges the bit line. Then the memory device prepares the next operation.

At this time, a bit line precharge signal generator generates a signal for precharging the bit line.

FIG. 1A is a block diagram showing a path in which precharge signals blp, bleqd, and blequ generated by a conventional precharge signal generator 140 are applied to a plurality of bit line sense amplifier arrays 100, 110, 120, and 130.

As shown in FIG. 1A, the precharge signal generator 140 generates and outputs the precharge signals blp, bleqd, and blequ to the plurality of bit line sense amplifier arrays 100, 110, 120, and 130. Each of the bit line sense amplifier arrays 100 includes a plurality of bit line sense amplifiers. The signal blp denotes a bit line precharge signal, the signal bleqd denotes a bit line equalize down signal, and the signal blequ denotes a bit line equalize up signal. Memory cell arrays are located at both sides of the bit line sense amplifier. The signals bleqd and blequ are signals for controlling bit lines which are located at upper and lower memory cell arrays, respectively (FIG. 1C).

FIG. 1B is a circuitry diagram showing one example of the bit line precharge signal generator 140 shown in FIG. 1A. In FIG. 1B, an input signal bsx_u represents a signal which activates an output signal blequ.

FIG. 1C is a circuitry diagram showing one example of a conventional bit line sense amplifier. The bit line sense amplifier is included in the bit line sense amplifier array of FIG. 1A.

As shown in FIG. 1C, the bit line sense amplifier includes an amplifier, a first bit line equalizing transistor N1, first bit line isolation transistors N11 and N12, second bit line isolation transistors N21 and N22, a second bit line equalizing transistor N2, and bit line precharge transistors N3 and N4.

The first bit line equalizing transistor N1 is arranged at an upper portion of the amplifier. The first bit line isolation transistors N11 and N12 are arranged between the amplifier and the first bit line equalizing transistor N1. The second bit line isolation transistors N21 and N22 are arranged at a lower portion of the amplifier. The second bit line equalizing transistor N2 is arranged at the lower portion of the amplifier. The bit line precharge transistors N3 and N4 are arranged between the amplifier and the second bit line isolation transistors N21 and N22.

The first bit line equalizing transistor N1 is driven by the signal blequ. The second bit line equalizing transistor N2 is driven by the signal bleqd. The bit line precharge transistors N3 and N4 are driven by the signal blq.

In FIG. 1C, control signals C1 and C2 function to connect the bit lines BL and /BL to the amplifier. For example, during the reading operation, data of the the bit lines BL and /BL are transferred to a sense amplifier. The sense amplifier amplifies the data. During the writing operation, data transferred to the amplifier are transferred to the bit lines BL and /BL.

As described above, the signal blequ and the signal bleqd are signals for controlling bit lines which are located at upper and lower cell arrays.

When the signal blp of a high level is applied to the bit line sense amplifier, the voltage of the bit line in which the amplifier is located is equalized by a control voltage vblp.

The sense amplifier shown in FIG. 1C will be apparent to a person having ordinary skill in the art and having studied such a memory device, so description of details thereof will be omitted.

However, operations of the conventional bit line sense amplifier array and bit line precharge generator of FIGS. 1A and 1B have problems as follows.

(1) Since a plurality of bit line signals blp, bleqd, and blequ outputted from the bit line precharge signal generator are transferred to the bit line sense amplifier array, the signal line becomes longer, thus increasing a line resistance and causing difficulties for a layout.

(2) As known in prior art, referring to FIG. 1C, the bit line precharge signal blp, the bit line equalize down signal blequ, and the bit line equalize up signal blequ are applied to gates of the bit line precharge transistors N3 and N4, a gate of the second equalizing transistor N2, and a gate of the first equalizing transistor N1 to switch a bit line pair. The transistors functioning as switching means are located between the bit line pair. The bit line signals blp, bleqd, and blequ are applied to a gate of a corresponding transistor to turn on/off the corresponding transistor. When the transistors are turned on, the bit line pair are equalized at a constant voltage. In FIG. 1A, one bit line sense amplifier array includes a plurality of bit line sense amplifiers. Bit line signals are applied to corresponding transistors N1, N2, N3, and N4. However, since a capacitance component exists in gates of the transistors which receive the bit line signals, an RC time delay occurs due to a resistance component of a signal line of the bit line and the capacitance component existing in gates of the transistors which receive the bit line signals.

As shown in FIG. 1A, since a plurality of sense amplifier arrays are connected to each bit line signal in parallel, the capacitance component is increased to cause a significant RC time delay.

As stated previously, according to the conventional bit line precharge signal generator, (1) the signal line is long in order to increase the resistance component, and (2) since a plurality of bit line sense amplifier arrays are connected to the signal line in parallel, the capacitance component is increased, thus increasing a time delay during the applying of the bit line signal.

SUMMARY OF THE INVENTION

Accordingly, the present invention has been made to solve the above-mentioned problems occurring in the prior art, and an object of the present invention is to provide a bit line precharge signal generator for a memory device, which reduces a resistance component of a signal line by shortening the length of a signal line transferring bit line signals, and reduces an RC time delay.

Another object of the present invention is to provide a bit line signal generator which substitutes one bit line signal for a plurality of bit line signals blp, bleqd, and blequ in order to reduce the number of signal lines and the number of signals.

In accordance with the present invention, there is provided a bit line precharge signal generator for a memory device, the memory device having a plurality of bit line sense amplifier arrays, the bit line precharge signal generator comprising: a control signal generator for generating a first control signal; and a plurality of bit line precharge signal drivers being controlled by the first control signal from the control signal generator, wherein each of the bit line precharge signal drivers applies a second signal to the bit line sense amplifier array which is adjacent to the bit line precharge signal driver.

Preferably, the plurality of bit line precharge signal drivers are arranged alternately with respect to the plurality of bit line sense amplifier arrays. More preferably, each of the bit line sense amplifier arrays includes a plurality of bit line sense amplifiers, and the second signal is applied to each of the plurality of bit line sense amplifiers. Most preferably, the second signal is a bit line precharge signal which is necessary to the plurality of bit line sense amplifiers.

Also, each of the plurality of bit line sense amplifiers includes an amplifier; a first bit line equalizing transistor arranged at an upper portion of the amplifier; first bit line isolation transistors arranged between the amplifier and the first bit line equalizing transistor; second bit line isolation transistors arranged at a lower portion of the amplifier; a second bit line equalizing transistor arranged at the lower portion of the amplifier; and bit line precharge transistors arranged between the amplifier and the second bit line isolation transistors, wherein the first and second bit line equalizing transistors, and the bit line precharge transistors are driven by the second signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
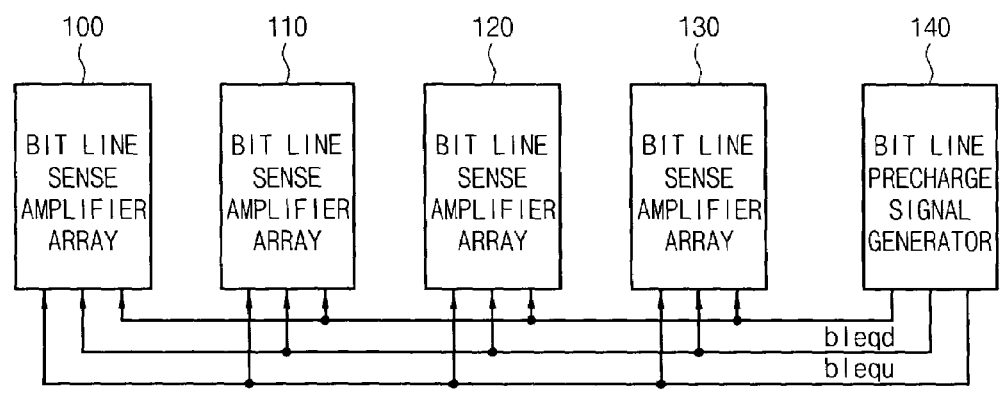
FIG. 1A is a block diagram showing a path in which precharge signals generated by a conventional precharge signal generator are applied to bit line sense amplifier arrays.
Figure 1B:
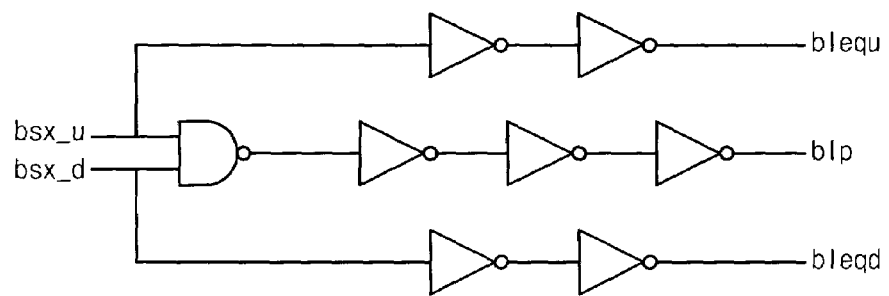
FIG. 1B is a circuitry diagram showing one example of the bit line precharge signal generator shown in FIG. 1A.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2A:
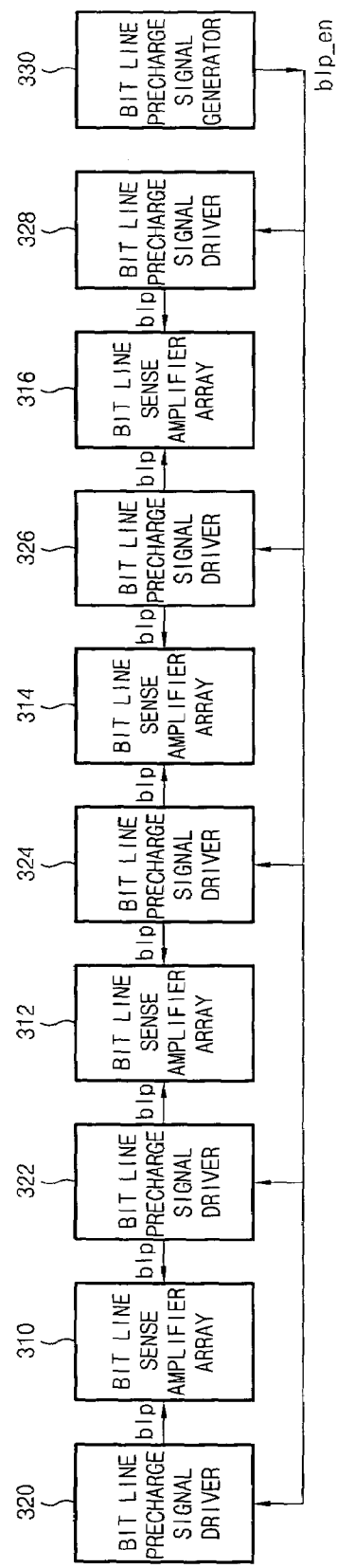
FIG. 2A is a block diagram showing a configuration of a bit line precharge signal generator for a memory device according to an embodiment of the present invention.

FIG. 2A is a block diagram showing a configuration of a bit line precharge signal generator for a memory device according to an embodiment of the present invention.

As shown in FIG. 2A, the bit line precharge signal generator includes a control signal generator (=bit line precharge signal generator) 330 and a plurality of bit line precharge signal drivers 320, 322, 324, and 326.

The control signal generator 330 generates a bit line precharge enable signal blp_en. The plurality of bit line precharge signal drivers 320, 322, 324, and 326 are controlled by the bit line precharge enable signal blp_en from the control signal generator 330.

Figure 2B:
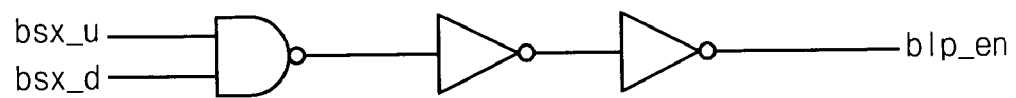
FIG. 2B is a circuit diagram showing an example of a control signal generator shown in FIG. 1A.

FIG. 2B is a circuit diagram showing an example of a control signal generator 330 shown in FIG. 1A. As shown in FIG. 2B, input signals bsx_u and bsx_d are both at high levels, and the control signal generator 330 outputs a signal blp_end of a low level. The plurality of bit line sense amplifier arrays 310 alternate with the plurality of bit line precharge signal drivers. That is, the bit line sense amplifier array 310 is adjacently located at a left side of the bit line precharge signal driver 320. The bit line precharge signal driver 322 is adjacently located at a left side of the bit line sense amplifier array 310. The bit line sense amplifier array 312 is adjacently located at a left side of the bit line precharge signal driver 322. The remaining bit line precharge signal drivers and the remaining bit line sense amplifier arrays are placed in alternation with each other.

Each of the bit line precharge signal drivers 320, 322, 324, and 326 applies a bit line precharge signal blp to the bit line sense amplifier arrays 310, 312, 314, and 316 which are adjacent to the bit line precharge signal drivers 320, 322, 324, and 326.

As noted above, since the control signal generator 330 controls the bit line precharge signal drivers 320, 322, 324, and 326, when the bit line precharge signal drivers 320, 322, 324, and 326 are enabled according to the bit line precharge enable signal blp_en from the control signal generator 330, the bit line precharge signal drivers 320, 322, 324, and 326 apply the bit line precharge enable signal blp_en to the bit line sense amplifier arrays 310, 312, 314, and 316, respectively.

Figure 3:
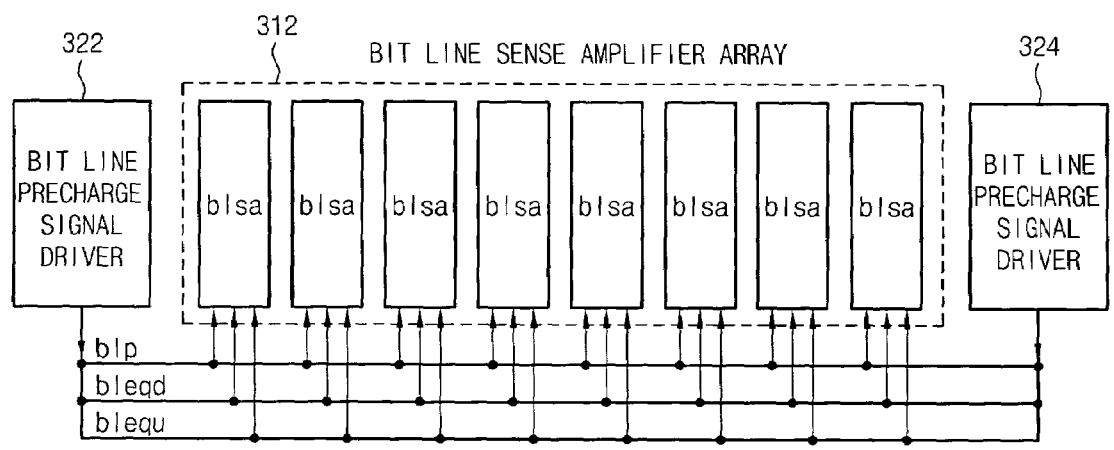
FIG. 3 is a view for illustrating that each of the bit line sense amplifier arrays has a plurality of bit line sense amplifiers.

FIG. 3 is a view for illustrating each of the bit line sense amplifier arrays having a plurality of bit line sense amplifiers.

As shown in FIG. 3, the bit line sense amplifier array 312 of FIG. 2A receives the bit line precharge signals blp from the bit line precharge signal drivers 322 and 324 which are both adjacent to the bit line sense amplifier array 312. The conventional bit line precharge signal generator shown in FIG. 1A generates and applies three signals blp, bleqd, and blequ to each bit line sense amplifier array. However, the bit line precharge signal driver according to the present invention shown in FIGS. 2A and 4 outputs one bit line precharge signal blp. The bit line precharge signal blp is commonly used for three signals blp, bleqd, and blequ.

Accordingly, in an embodiment of the present invention, the three signals blp, bleqd, and blequ are all at high or low levels, different from the logic levels in the conventional bit line precharge signal generator.

Namely, a configuration of the bit line sense amplifier according to an embodiment of the present invention is identical with that of the conventional bit line sense amplifier. Signals applied to the bit line sense amplifier according to an embodiment of the present invention are different from those of the conventional bit line sense amplifier. The bit line sense amplifier according to the present invention includes an amplifier, a first bit line equalizing transistor N1, first bit line isolation transistors N11 and N12, second bit line isolation transistors N21 and N22, a second bit line equalizing transistor N2, and bit line precharge transistors N3 and N4. The first bit line equalizing transistor N1 is arranged at an upper portion of the amplifier. The first bit line isolation transistors N11 and N12 are arranged between the amplifier and the first bit line equalizing transistor N1. The second bit line isolation transistors N21 and N22 are arranged at a lower portion of the amplifier. The second bit line equalizing transistor N2 is arranged at the lower portion of the amplifier. The bit line precharge transistors N3 and N4 are arranged between the amplifier and the second bit line isolation transistors N21 and N22. The first and second bit line equalizing transistors N1 and N2, and the bit line precharge transistors N3 and N4 are driven by one signal blp.

Figure 1C:
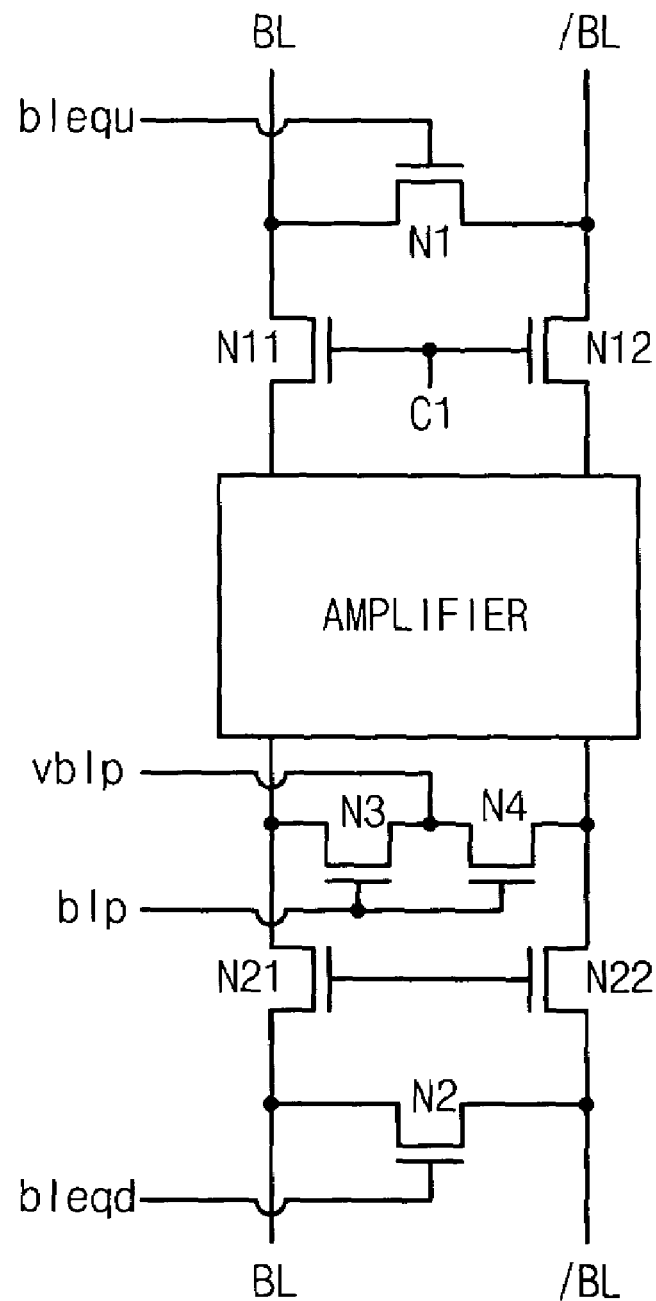
FIG. 1C is a circuitry diagram showing one example of a conventional bit line sense amplifier.

That is, in the conventional bit line precharge signal generator, referring to FIG. 1C, during the precharge operation, the signals blp, blequ, bleqd, C1, and C1 all have high levels. Also, during an active operation for amplifying upper bit lines BL and /BL, the signal blequ is at a low level, the signal bleqd is at a high level, the signal blp is at a low level, the signal C1 is at a high level, and the signal C2 is at a low level. The reason why the signal bleqd is at a high level during the amplification of the upper bit lines BL and /BL is that the signal C2 is at a low level and the lower bit lines insulate from the upper bit lines and the amplifier. The logic state of the signal bleqd has no effect on the operation of the sense amplifier. In the conventional bit line precharge signal generator, the reason why the signal bleqd is maintained at a high level during the amplification of the upper bit lines, is, because it is unnecessary to change the signal bleqd of the high level during the precharge operation to a low level. As shown in FIG. 1A, three signals blp, blequ, and bleqd are related to the bit line precharge signal.

Accordingly, when the bit line precharge signal driver according to the present invention uses all the three signals blp, blequ, and bleqd, the number of signals outputted from the bit line precharge signal driver is 6. Since the number of signal lines applied to a bit line sense amplifier area is closely related to the performance of the memory device, it is not preferable to increase the number of signals outputted from the bit line precharge signal driver. In the conventional bit line precharge signal generator, the first and second equalizing transistors N1 and N2 and the bit line precharge transistors N3 and N4 are driven according to three signals blequ, bleqd, and blp, whereas they are driven by one signal blp in the present invention.

Figure 4:
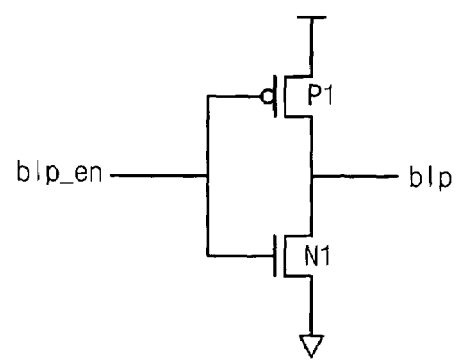
FIG. 4 is a circuitry diagram showing one example of the bit line precharge signal driver shown in FIG. 2A.

FIG. 4 is a circuitry diagram showing one example of the bit line precharge signal driver shown in FIG. 2A.

As shown in FIG. 4, the bit line precharge signal driver is a CMOS inverter which has a PMOS transistor P1 and an NMOS transistor N1. The bit line precharge signal blp of a low level is outputted when a control signal of a high level is applied to the bit line precharge signal driver, whereas the bit line precharge signal blp of a high level is outputted when a control signal of a low level is applied to the bit line precharge signal driver.

As shown in FIGS. 2A through 4, the RC time delay according to the present invention is obtained by summing a multiplication of a resistance of a line and capacities of gates and a multiplication of a resistance of an output signal line of each bit line precharge signal driver and a capacitance of a bit line sense amplifier array. The bit line enable signal blp_en is transferred to the line. The gates are formed at input terminals of a plurality of bit line precharge signal drivers shown in FIG. 4. The bit line sense amplifiers array receives an output signal of an output signal line of each bit line precharge signal driver. Accordingly, the RC time delay according to the present invention is less than that of the conventional bit line precharge signal generator shown in FIG. 1A.

As mentioned above, when using the bit line precharge signal generator according to the present invention, a necessary operation is performed within a short time, and unnecessary signal lines are reduced. As a result, a total layout area is reduced.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A bit line precharge signal generator for a memory device, the memory device having a plurality of bit line sense amplifier arrays, the bit line precharge signal generator comprising:
    a control signal generator for generating a first control signal; and
    a plurality of bit line precharge signal drivers being controlled by the first control signal from the control signal generator,
        wherein each of the bit line precharge signal drivers applies a second signal to the bit line sense amplifier array which is adjacent to the bit line precharge signal driver, and
        wherein the plurality of bit line precharge signal drivers are arranged alternately with respect to the plurality of bit line sense amplifier arrays.

2. The bit line precharge signal generator according to claim 1, wherein each of the bit line sense amplifier arrays includes a plurality of bit line sense amplifiers, and the second signal is applied to each of the plurality of bit line sense amplifiers.

3. The bit line precharge signal generator according to claim 2, wherein the second signal is a bit line precharge signal, which is necessary for the plurality of bit line sense amplifiers.

4. The bit line precharge signal generator according to claim 2, wherein each of the plurality of bit line sense amplifiers includes:
    an amplifier;
    a first bit line equalizing transistor arranged at an upper portion of the amplifier;
    first bit line isolation transistors arranged between the amplifier and the first bit line equalizing transistor;
    second bit line isolation transistors arranged at a lower portion of the amplifier; and
    bit line precharge transistors arranged between the amplifier and the second bit line isolation transistors,
    wherein the first and second bit line equalizing transistors, and the bit line precharge transistors are driven by the second signal.

5. A bit line precharge signal generator for a memory device having a bit line sense amplifier array comprising:
    a control signal generator for generating a bit line precharge enable signal;

a first precharge driver for generating a first precharge signal to precharge the bit line sense amplifier array in response to the bit line precharge enable signal; and a second precharge driver for generating a second precharge signal to precharge the bit line sense amplifier array in response to the bit line precharge enable signal;

wherein the first precharge driver and the second precharge driver are located adjacently to both sides of the bit line sense amplifier array.

6. The bit line precharge signal generator according to claim 5, wherein the first precharge signal includes an upper sense amplifier array precharge signal controlling an upper part of the sense amplifier array and a lower sense amplifier array precharge signal controlling a lower part of the sense amplifier array.

7. The bit line precharge signal generator according to claim 6, wherein the control signal generator includes a NAND gate receiving both the upper sense amplifier array precharge signal and the lower sense amplifier army precharge signal and a buffer receiving an output from the NAND gate.

* * * * *